United States Patent
Ravatin et al.

(10) Patent No.: US 7,843,238 B2
(45) Date of Patent: Nov. 30, 2010

(54) CIRCUIT FOR DISCHARGING AN ELECTRICAL LOAD, POWER OUTPUT STAGE COMPRISING SUCH A DISCHARGE CIRCUIT FOR THE CONTROL OF PLASMA DISPLAY CELLS, AND RELATED SYSTEM AND METHOD

(75) Inventors: François Ravatin, La Murette (FR); Gilles Troussel, Grenoble (FR)

(73) Assignee: STMicroelectronics, SA, Montrouge (FR)

( * ) Notice: Subject to any disclaimer, the term of this patent is extended or adjusted under 35 U.S.C. 154(b) by 438 days.

(21) Appl. No.: 11/804,718

(22) Filed: May 18, 2007

(65) Prior Publication Data

US 2008/0007308 A1    Jan. 10, 2008

Related U.S. Application Data

(63) Continuation-in-part of application No. PCT/FR2005/002801, filed on Nov. 10, 2005.

(30) Foreign Application Priority Data

Nov. 18, 2004   (FR) .................................. 04 12216

(51) Int. Cl.
   *H03B 1/00*    (2006.01)
(52) U.S. Cl. ...................................... 327/112; 327/108
(58) Field of Classification Search .................. None
   See application file for complete search history.

(56) References Cited

U.S. PATENT DOCUMENTS

| | | | |
|---|---|---|---|
| 4,779,013 A | 10/1988 | Tanaka | |
| 5,598,119 A * | 1/1997 | Thayer et al. | 327/111 |
| 6,466,186 B1 * | 10/2002 | Shimizu et al. | 345/60 |
| 6,751,782 B2 * | 6/2004 | Levin et al. | 716/1 |
| 6,784,857 B1 * | 8/2004 | Nakamura | 345/60 |
| 6,803,888 B1 * | 10/2004 | Nakamura et al. | 345/60 |
| 7,154,310 B2 * | 12/2006 | Kojima | 327/130 |
| 7,319,442 B2 * | 1/2008 | Nakamura et al. | 345/60 |

FOREIGN PATENT DOCUMENTS

| | | |
|---|---|---|
| EP | 1087364 | 3/2001 |
| FR | 2763735 | 11/1998 |
| WO | PCT/US88/01051 | 10/1988 |

OTHER PUBLICATIONS

PCT/FR2005/002801, STMicroelectronics SA, Published May 26, 2006—Search Report.

* cited by examiner

*Primary Examiner*—Cassandra Cox
(74) *Attorney, Agent, or Firm*—Lisa K. Jorgenson; Kevin D. Jablonski; Graybeal Jackson LLP

(57) ABSTRACT

An embodiment of a discharge circuit comprises an output circuit with one output connected to an electrical load to absorb a discharge current given by the load when a logic signal commands a discharge of the load. The discharge circuit also comprises a control circuit to give the output circuit an appropriate control signal so that a slope of an output potential of the output circuit diminishes gradually when the logic signal commands a discharge of the load. Limiting the slope of the output potential gradually (and not suddenly) may limit the electromagnetic radiation generated by these variations.

20 Claims, 3 Drawing Sheets

US 7,843,238 B2

CIRCUIT FOR DISCHARGING AN ELECTRICAL LOAD, POWER OUTPUT STAGE COMPRISING SUCH A DISCHARGE CIRCUIT FOR THE CONTROL OF PLASMA DISPLAY CELLS, AND RELATED SYSTEM AND METHOD

PRIORITY CLAIM

This is a continuation-in-part application which claims priority from PCT/FR2005/002801, published in French, filed Nov. 10, 2005, based on French patent Application No. 0412216, filed Nov. 14, 2004, which is incorporated herein by reference.

BACKGROUND

1. Technical Field

An embodiment of the invention relates to a discharge circuit comprising an output circuit having one output connected to an electrical load, for example of a capacitive type, to absorb a discharge current given by the load when a logic signal commands a discharge of the load. An embodiment of the invention is especially valuable for the making of power output stages for the control of high-voltage circuits such as, for example, plasma display panels.

A plasma display panel is a matrix type screen or panel formed by cells positioned at the intersections of rows and columns. A cell comprises a cavity filled with a rare gas, two control electrodes, and a deposit of red, green or blue phosphorus. To create a light dot on the screen in using a given cell, a potential difference is applied between the control electrodes of this cell, so as to activate an ionization of the gas. This ionization is accompanied by an emission of ultraviolet rays. The creation of the light dot is obtained by the excitation of the deposited phosphorus by the emitted rays.

The cells are classically activated to create images by means of logic circuits producing control signals. The logic states of these signals determine the cells that are commanded to produce a light dot and the cells that are commanded not to produce any light. The logic circuits are generally powered at low voltage, for example voltage of 5V or less. This voltage is typically not sufficient to directly drive the electrodes of the cells. Between the logic circuits and the cells to be controlled, power output stages are therefore used to convert the low-voltage control signals into high-voltage control signals.

The ionization of the gas of the cavities typically necessitates the application of high potentials to the control electrodes, for example, about 100 V. Furthermore, it may be necessary to be able to provide the electrodes with high currents, in the range of several tens of milliamperes (and correlatively to be able to receive these currents from these electrodes). Indeed, the electrodes may be represented schematically by equivalent capacitors having relatively high capacitance values of about 100 picofarads. The controlling of the electrodes may be, therefore, equivalent to the control implemented for charging or discharging a capacitor.

In plasma display panels, it is generally desired to obtain signals (current, voltage signals) that have fast edges (i.e., rise and fall times). This represents, for example, charging or discharging times of about 100 nanoseconds. Given the high potential to be attained and the size of the capacitive charge, this entails the assumption that it is possible to provide very high charging currents and absorb very high discharge currents that could go up to about 100 milliamperes in one example.

2. Description of the Prior Art

FIG. 1 illustrates an example of a classical embodiment of an output stage used to control an electrode schematically represented by a capacitor CLoad. The stage has a potential step-up circuit (i.e., a level shifter) 10, and an output circuit 20. The circuit 10 has the function of converting a low-voltage logic control signal IN into a high-voltage logic control signal INP varying between a low voltage such as 0 V and a high-voltage VPP, and following the variations of the signal IN. The circuit 20 has a P type transistor T21 for charging the capacitor CLoad and an N type transistor T22 for discharging this capacitor CLoad. The transistor T21 is driven by the high-voltage control signal INP: when it is on, the transistor T21 gives the load CLoad a charging current, which will give rise to an increase in the potential OUT up to VPP. The transistor T22 is driven by the low-voltage control signal IN: when it is on, the transistor gives the load CLoad a discharge current proportional to the potential of the signal IN and the potential OUT decreases along a slope proportional to the discharging current. The circuit of FIG. 1 is described at greater length in French patent FR 2,763,735.

Apart from the relatively large sizes of the transistor T22 and the transistor T21, one drawback of the circuit of FIG. 1 is the risk of simultaneous conduction of the transistors T21, T22. This risk entails major dissipation, given the values of voltage and current present in the circuit.

Yet another drawback of the circuit of FIG. 1 lies in the electromagnetic disturbances that it causes in the cells of the plasma display panel. Indeed, as seen here above, the voltage and currents brought into play are substantial and they vary in substantial proportions over very short periods of time during changes in state of the control signal. These sudden, high-amplitude variations in the voltages and currents may give rise to electromagnetic radiation that disturbs some or all of the cells of the plasma display panel.

French patent 2,763,735 also proposes another structure of an output stage that reduces the surface area needed for the charging transistor T21 and that prevents the simultaneous conduction of the transistors T21, and T22 during changes in the state of the control signal. To this end, the charging transistor T21 is replaced by a charging circuit comprising an N type transistor driven by a control circuit comprising the transistor and one diode; the charging transistor has a mode of operation similar to that of the PMOS type transistor which it replaces. But even though the size of the N type transistor is reduced relative to that of the transistor T21 of FIG. 1, the total size of the charging circuit is appreciably greater. This is because in this structure, the discharging transistor is a DMOS type transistor, which has the advantage of having particularly short power-off and power-on times, but is, on the contrary, far bulkier and furthermore requires control inverters (to introduce delays in the control signals, the delays being necessary to prevent the charging circuit and the DMOS transistor from being powered on simultaneously), which further increases the total size of the output circuit. Furthermore this circuit structure does not provide any solution to limiting the electromagnetic disturbances generated by the changes in the state of the control signal IN.

SUMMARY

An embodiment of the invention proposes an alternative to the prior-art output circuits that limits the electromagnetic radiation likely to disturb the downstream circuits such as the cells of a plasma display panel, and furthermore consumes little energy, and is of limited size.

As in the case of the prior-art circuits, the discharge circuit of an embodiment of the invention has an output circuit with one output connected to an electrical load to absorb a discharge current given by the load when a logic signal IN commands a discharge of the load.

The discharge circuit according to an embodiment of the invention also comprises a control circuit to give the output circuit an appropriate control signal so that a slope of an output potential of the output circuit gradually diminishes when the logic signal commands a discharge of the load.

Thus, with the control circuit according to an embodiment of the invention, the slope of the output potential diminishes gradually and slowly, unlike prior-art output circuits where the slope varies abruptly when the logic signal commands a discharge of the load and then remains constant.

Since the electromagnetic radiation in prior-art output circuits is typically produced by sudden and major changes in the slope of the output potential, the circuit of the invention limits the electromagnetic radiation by limiting the amplitude of the variations of the slope of the output potential.

For example, the discharge circuit according to an embodiment of the invention includes means to gradually and slowly increase a potential of the control signal when the logic signal is active. This restricts the variations of the slope of the output potential, inasmuch as the slope of the output potential is proportional to the potential of the control signal, as shall be seen more clearly here below in the examples.

An embodiment of the invention also relates to a power output stage for the control of an electrical load, the output stage comprising a load circuit to give the load a charging current when a logic signal commands a charging of the load. According to an embodiment of the invention, the power output stage also comprises a discharge circuit as described here above.

An embodiment of the invention also concerns a display panel comprising at least one capacitive type cell to create a light dot on the screen, and an addressing circuit to produce a logic signal for the control of the cell.

A panel according to an embodiment of the invention also has an output stage, as described here above, to control the cell through the control logic signal.

The panel is, for example, of the plasma panel or flat panel type.

BRIEF DESCRIPTION OF THE DRAWINGS

One or more embodiments of the invention will be understood and features and advantages shall appear from the following description of an exemplary mode of implementation of a discharge circuit and a power output stage. The description refers to the appended drawings, of which.

DETAILED DESCRIPTION

Figure 2:
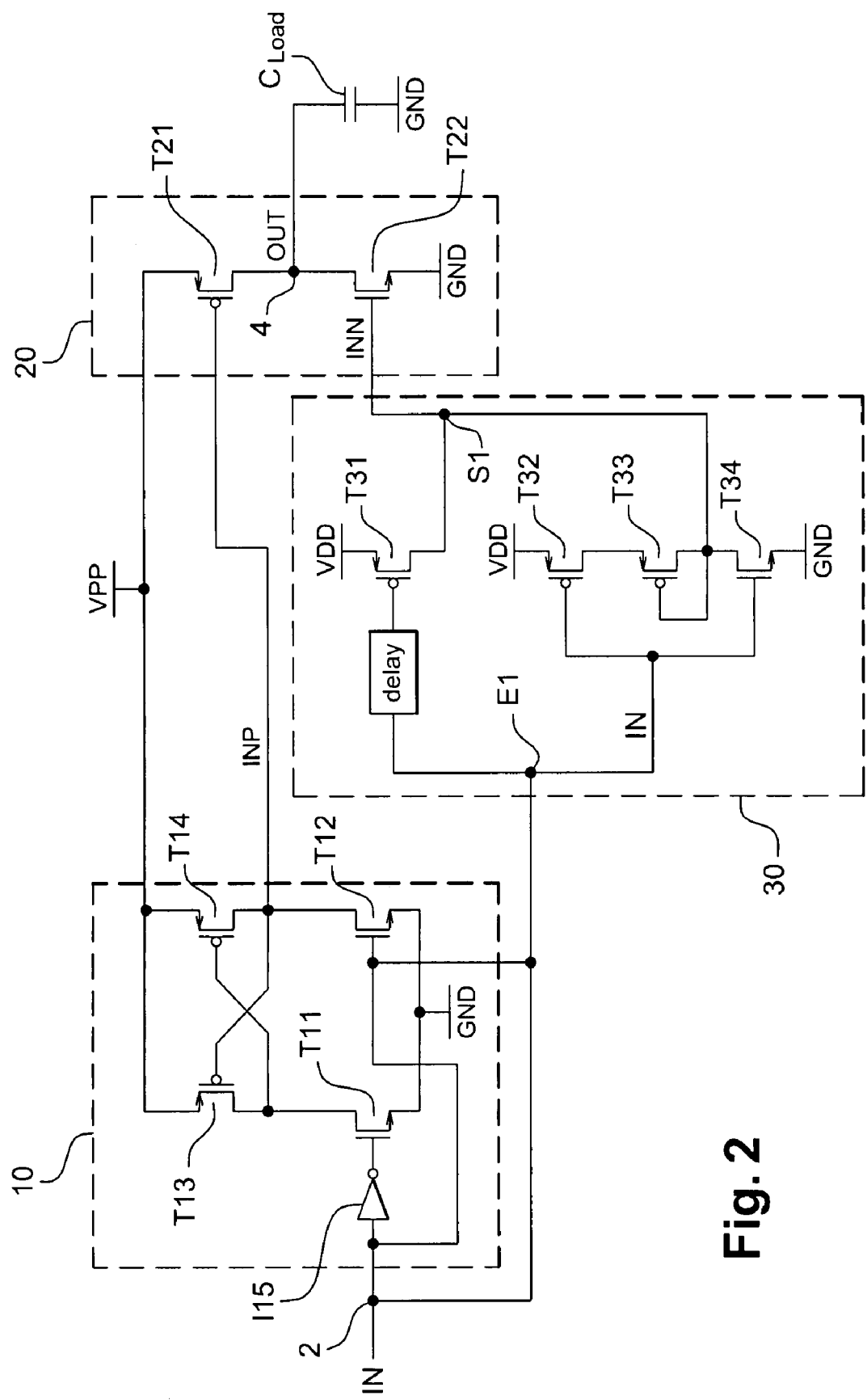
FIG. 2 illustrates an embodiment of an output stage according to the invention.

The output stage of FIG. 2 has a voltage step-up circuit 10, an output circuit 20, and a control circuit 30; the output stage receives an input logic signal IN at an input 2 and produces a potential OUT at a capacitive load CLoad connected with its output 4. The circuit 20 is designed to charge the load CLoad when IN is inactive (herein equal to a logic "1") and discharge the load CLoad when IN is active, herein equal to a logic "0".

The output stage receives a low-voltage power supply potential VDD, for example of about 5 V, a high-voltage power supply potential VPP, for example of about 70 to 120 V, and a reference potential GND corresponding to a ground of the circuit.

The input logic signal IN is a low-voltage logic signal, taking two logic values "0" or "1", respectively corresponding to the potential GND and to the potential VDD. The potential step-up circuit 10 and the output circuit 20 are identical to those of FIG. 1.

The circuit 10 has the function of raising the potential of the input logic signal IN, and of producing a high-voltage logic signal INP that follows the variations of the signal IN:

INP=VPP when IN=GND (logic "0")

INP=GND when IN=VDD (logic "1")

The output circuit 20 has a P type charging transistor T21, and an N type discharging transistor T22. The charging transistor T21 is controlled by the high-voltage control signal INP: it provides a charging current at the output 4, to bring the output potential OUT substantially to the level of the potential VPP in charging the capacitor CLoad.

The discharging transistor T22 is controlled by a low-voltage control signal INN; T22 enables the absorption of a discharge current given by the load CLoad at the output 4, to bring the output potential OUT substantially to the level of the reference potential GND. The discharging current is proportional to the potential of the signal INN at the gate of T22.

The control circuit 30 receives the input logic signal IN and, as a function of the signal IN, produces the low-voltage control signal INN, appropriate so that a slope of the output potential OUT diminishes gradually when the signal IN commands a discharge of the output (namely IN active at 0). The slope of the output potential is limited. To this end, the circuit 30 produces a signal INN which varies gradually between 0 and VDD when IN goes from 1 (VDD) to 0 (GND) so that the variations of the signal INN have a limited slope.

In the example of FIG. 2, the control circuit 30 comprises two arms parallel-connected between the input E1 of the circuit 30 to which the signal IN is applied, and the output S1 of the circuit 30 at which the signal INN is produced.

The first arm has two P type transistors T32, T33 and one N type transistor T34. The potential VDD is applied to the source of T32 whose drain is connected to the source of T33. T33 is diode-mounted; it has a gate connected to its drain, to the output S1 of the circuit 30 and to the drain of T34 whose source is connected to the ground circuit (GND potential). T33 forms a potential drop circuit: at its output (=the drain of T33) it reproduces the potential that it receives at its input (=the source of T33) minus a value VC. The set comprising the transistors T32, T33, T34 forms a potential generator controlled by the signal IN, which produces:

GND if IN=VDD

VDD−VC if IN=0

The second arm comprises the following, connected in series:

a delay circuit Delay1 that reproduces the signal IN which it receives at its input but offset by a time Δ1.

A P type transistor T31 having a drain connected to the output S1, a gate connected to the output of the circuit Delay1 and a source to which the potential VDD is applied. T31 forms a generator of a potential equal to VDD, controlled by the logic signal produced by the circuit Delay1.

The circuit 30 works as follows.

When the signal IN applied to the input E1 goes from GND (logic "0") to VDD (logic "1"), the transistor T34 swiftly comes on and takes the signal INN to the potential GND. If the transistor T31 is on, the current which flows in its channel flows toward the ground by means of the transistor T34. At the end of the period Δ1 introduced by the circuit Delay1, the signal at the gate of T31 goes to VDD and the transistor T31 goes off.

Conversely, when the signal IN goes from VDD to GND, the transistor T34 goes off and the transistor T32 swiftly comes on (switching time of the transistors in the range of 10 to 55 ns). T33 also comes on, a current flows in the transistors T32, T33 and the potential INN at the drain of T33 is drawn to VDD−VC, where VDD is the potential at the source of T32 and VC is a potential drop introduced by the diode-mounted transistor T33. VC is for example in the range of 2 V for VDD in the range of 5 V. Then, at the end of the time $\Delta_1$ introduced by the circuit Delay1, the signal at the gate of the transistor T31 also goes to GND and the transistor T31 comes on. The current flowing in T31 then draws the potential of the point S1 to VDD.

In short:
when the signal IN goes from GND to VDD, the signal INN swiftly goes from VDD to GND through the action of the transistor T34, and
when the signal IN goes from VDD to GND, the signal INN swiftly goes from GND to VDD−VC, then to VDD at the end of the period $\Delta_1$.

Thus, when IN goes from VDD to GND, the signal INN goes from GND to VDD gradually in two steps and, during the period $\Delta_1$, passes through an intermediate potential level equal to VDD−VC.

The general working of the output stage is as follows.
When the signal IN goes from GND to VDD:
the signal INN goes from VDD to GND and turns the transistor T22 off,
the signal INP goes from VPP to GND and turns on the transistor T21 which gives a charging current to the capacitor CLoad: the potential OUT gradually climbs to the value VPP.
When the signal IN goes from VDD to GND:
the signal INP goes from GND to VPP and turns the transistor T21 off,
the signal INN goes from GND to VDD−VC, then to VDD at the end of the period $\Delta_1$.

The non-zero signal INN turns on the transistor T22, which absorbs a current for discharging the capacitor CLoad, proportional to the potential of the signal INN. The discharging of the capacitor leads to a diminishing of the potential OUT in a slope that is proportional to the discharging current and therefore proportional to the potential of the signal INN.

Thus:
at the beginning, during the period $\Delta_1$, the signal INN is at the potential VDD−VC: the potential at the point OUT will therefore decrease in a first slope P1 proportional to VDD−VC,
at the end of the period $\Delta_1$, the signal INN goes to the potential VDD: the potential OUT will decrease along a second slope P2 that is proportional to VDD and therefore greater than the first slope P1.

Thus, with the control circuit 30 according to an embodiment of the invention, the slope of the potential OUT decreases gradually (and not suddenly as in prior-art circuits), in two steps, along two slopes: a first slight slope P1 and then a second sharper slope P2. Thus, the amplitude of the changes in curvature of the potential of the signal OUT are limited. In other words, the control circuit 30 according to an embodiment of the invention is used to smoothen the curve of discharge of the capacitor, and this may limit the electromagnetic disturbances at the capacitor, plasma display panel, etc.

Figure 3:
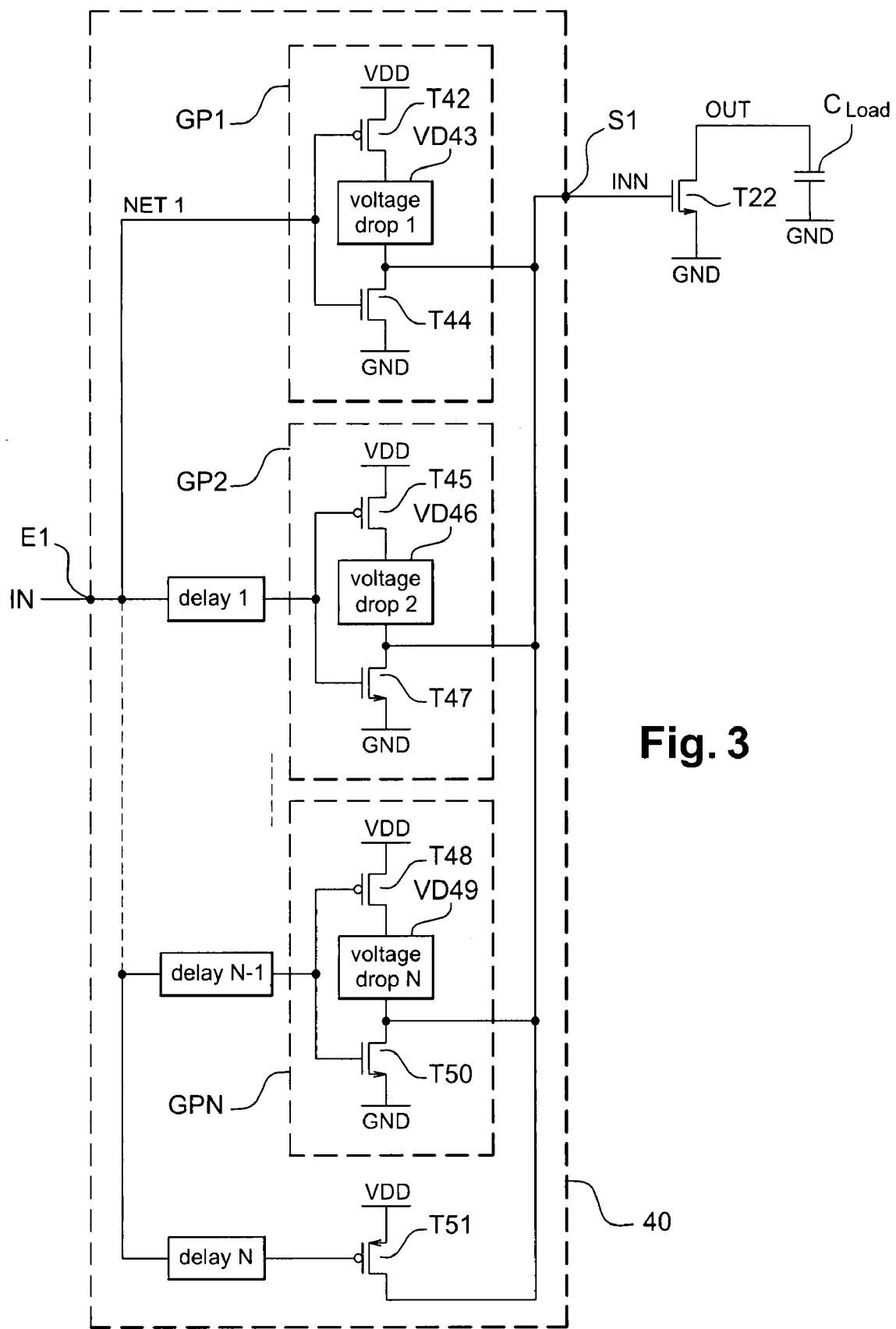
FIG. 3 shows an alternative version of a control circuit for an output stage according to FIG. 2.

FIG. 3 shows an alternate version of the control circuit of FIG. 2, used to even further smoothen the variations of the discharge curve of the capacitor CLoad, and therefore even further limit the electromagnetic disturbances at the load CLoad. FIG. 3 also shows the capacitor CLoad and the discharging transistor T22 of the output circuit. The rest of the output circuit is omitted from FIG. 3.

The control circuit 40 of FIG. 3 has N+1 arms parallel-connected between the input E1 of the circuit 40 to which the signal IN is applied, and the output S1 of the circuit 40 at which the signal INN is produced. N is an integer greater than or equal to 2.

The first arm ranked n=0 has a first potential generator GPI controlled by the signal IN: it produces a potential VDD1 ranging from GND to VDD when it receives a signal IN active at GND and it produces a potential equal to GND when it receives the signal IN inactive at VDD. The potential generator GP1 has a P type transistor T42, a potential drop circuit VD43 and an N type transistor T44. The potential VDD is applied to the source of T42 having its drain connected to an input of the circuit VD43 which has an output connected to the drain of T44 whose source is connected to the ground of the circuit (GND potential). The common gate of the transistors T42, T44 forms a control input of the generator GPI and it is connected to the input E1 of the circuit 40; the common point of the potential drop circuit VD43 and of the transistor T44 forms an output of the generator GPI and it is connected to the output S1 of the circuit 40.

The potential drop circuit VD43 is sized so as to cause a drop in potential VC1 such that, when the transistor T42 is on, the potential VDD1 at output of the circuit VD43 is equal to VDD1=VDD−VC1. The circuit VD43 is, for example, a diode-mounted transistor (cf. the transistor T33 in the example of FIG. 2), a diode, an electrical resistor, etc., in other words, any electrical circuit liable to cause a drop in potential, although it may be desirable to select a circuit that consumes the least energy possible.

The second arm ranked n=1 comprises the following associated in series:
a first Delay circuit Delay1, which reproduces the signal that it receives at its input at output, but offset by a period $\Delta_1$.
A second potential generator GP2 controlled by the signal produced by the circuit Delay1: the generator GP2 produces a potential VDD2 ranging from VDD1 to VDD when it receives an active signal at GND (=the signal IN offset in time by $\Delta_1$).

A delay circuit such as Delay1 may be formed, for example, by an even number of inverters associated in series.

The second potential generator GP2 is similar to the first generator GPI; the generator GP2 has a P type transistor T45, a potential drop circuit VD46 and an N type transistor T47. The potential VDD is applied to the source of T45 having its drain connected to an input of the circuit VD46 and having one output connected to the drain of T47 whose source is connected to the ground of the circuit (potential GND). The common gate of the transistors T45, T47 forms a control input of the potential generator and it is connected to the output of the circuit Delay1; the common point of the potential drop circuit VD46 and of the transistor T47 forms an output of the potential generator GPI and it is connected to the output S1 of the circuit 40. The circuit VD46 introduces a drop in potential VC2 between the drain of. T45 and the source of T47 such that VDD2=VDD−VC2.

The arms ranked n=2 to n=N−1 are made similarly to the arm ranked n=1. They are distinguished from one another simply by the delay introduced by their delay circuit and by the potential that they produce at output. Thus, the arm ranked n (n varying between 2 and N−1) comprises the following associated in series:

a delay circuit Delay_n, which reproduces, at its output, the signal IN that it receives at its input but reproduces it offset by a period $\Delta n$ ranging from $\Delta n-1$ (delay in the arm ranked n−1) to $\Delta n+1$ (delay in the arm n+1).

A potential generator GP_n+1 controlled by the signal produced by the circuit Delay_n: when it receives the signal active at GND, the generator GPn produces a potential VDDn ranging from VDD_n (potential produced by the arm ranked n−1) to VDD_n+2 (potential produced by the arm ranked n+1).

Finally, the last arm ranked n=N comprises the following associated in series:

a delay circuit Delay_N, which reproduces the signal that it receives at its input at its output but offset by a period $\Delta N$ greater than $\Delta N-1$.

A P type transistor T51 having a drain connected to the output S1, a gate connected to the output of the circuit Delay_N and a source to which the potential VDD is applied. T31 forms a generator GPN of a potential equal to VDD, this generator being controlled by the logic signal produced by the circuit Delay_N.

The circuit 40 works as follows.

When the signal IN applied to the input E1 goes from GND (logic "0") to VDD (logic "1"), the transistor T42 goes off and the transistor T44 swiftly comes on: this transistor T44 brings the signal INN to the potential GND. At the end of the period $\Delta_1$ introduced by the circuit Delay1, the transistor T45 goes off and T47 comes on, at the end of the period $\Delta N-1$, T48 goes off and T50 comes on, . . . , at the end of the period $\Delta N$, T51 goes off—in one embodiment, T44 is large enough to sink the currents by GP2–GPN until these circuits stop sourcing current after the respective delay times $\Delta_2$_DN. Inversely, when the signal IN goes from VDD to GND, the transistor T44 goes off and the transistor T42 swiftly comes on (switching times of the transistors in the range of 2 ns). The potential INN at the point S1 is drawn toward VDD1=VDD−VC1 where VC1 is the potential drop introduced by the circuit VD43—in one embodiment, the circuit VD43 is large enough to source the currents sunk by GP2–GPN until these circuits stop sourcing current after the respective delay times $\Delta 2$−DN.

Then, at the end of the period $\Delta_1$ introduced by the circuit Delay1, the signal at the gate of the transistor T45 also goes to GND: T45 comes on and T47 goes off. The current flowing in the transistor T45 and in the circuit VD46 draws the potential of the point S1 to VDD2=VDD−VC2, VC2 (lower than VC1) being the drop in potential in the circuit VD46.

At the end of the period $\Delta N-1$ introduced by the circuit Delay_N−1, the signal at the gate of the transistor T48 also goes to GND: T48 comes on and T50 goes off. The current flowing in the transistor T48 and in the circuit VD49 draws the potential of the point S1 to VDD_N=VDD−VCN, VCN (VCN is below VCN−1) ranging from 0 to VCN−1.

Finally, at the end of the period $\Delta N$ introduced by the circuit Delay_N, the signal at the gate of the transistor T51 also goes to GND: the transistor T51 comes on and the current that flows through it draws the potential of the signal INN to VDD.

In short, when the signal IN goes from VDD to GND, the signal INN goes swiftly from GND to VDD1=VDD−VC1, then to VDD2=VDD−VC2 at the end of the period $\Delta 1$, then to VDD3=VDD−VC3 at the end of the period $\Delta_2$, . . . , then to VDD−N=VDD−VCN at the end of the period $\Delta N-1$, and finally to VDD at the end of the period $\Delta N$.

Thus, when IN goes from VDD to GND, the signal INN goes from GND to VDD in N+1 steps in passing successively through intermediate levels VDD1, VDD2, . . . , VDD_N, of gradually increasing levels in the course of time.

The gradual variations of the signal INN give rise to a gradual increase (N+1 successive slopes of increasing importance) of the discharge current flowing in the transistor T22 and hence equally gradual variations in the slopes of the potential OUT. The potential OUT may thus be smoothened even more efficiently than in the case of the circuit of FIG. 2, thus further limiting the electromagnetic disturbance.

Figure 1:
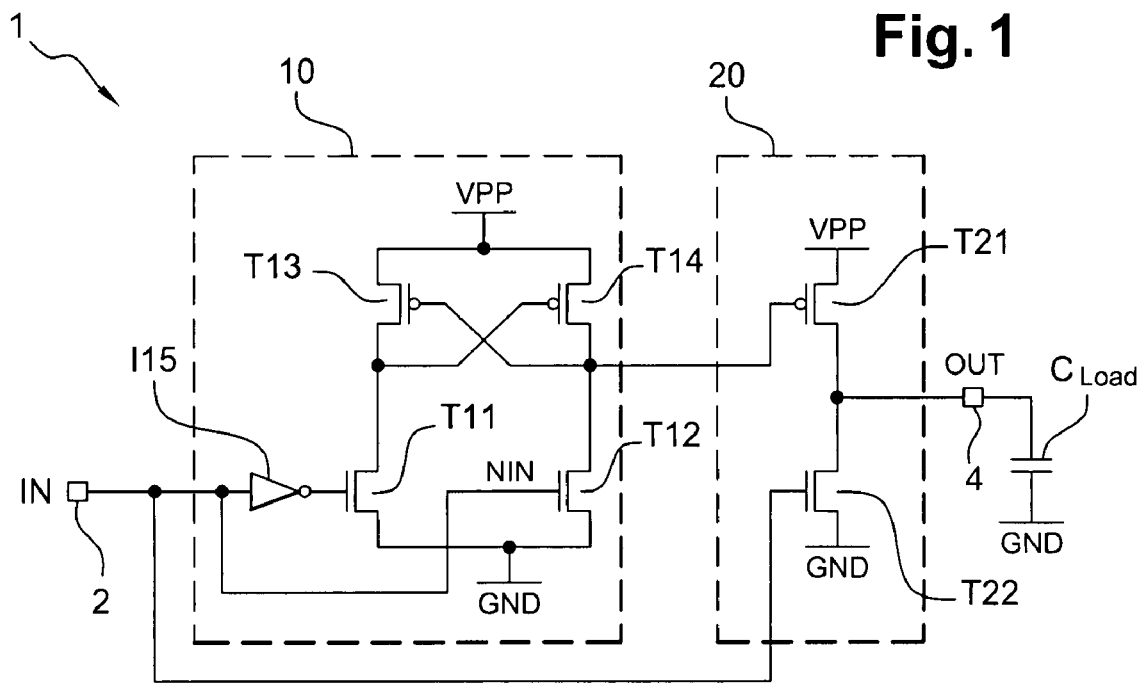
FIG. 1, already described, illustrates a prior art output stage.
Figure 4:
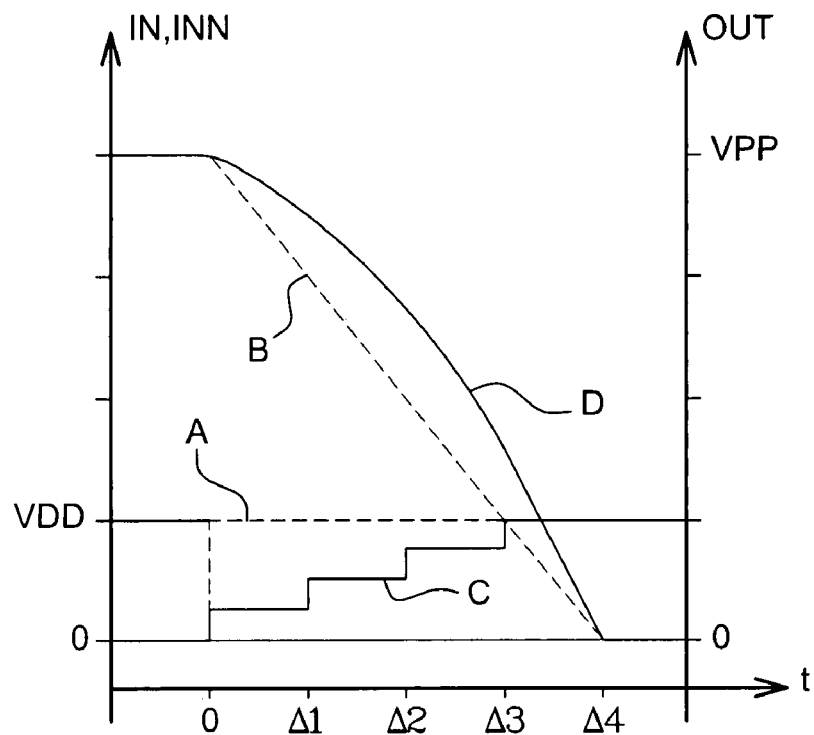
FIG. 4 shows the progress as a function of time of the output potential of the control circuit of FIG. 3.

By way of an illustrative example, FIG. 4 gives a view, when IN passes from VDD to GND, of:

the variations as a function of time of the signals INN and OUT (curves A, B shown in dashes) in the prior art circuit of FIG. 1 the variations as a function of time of the signals INN, OUT (curves C, D in solid lines) in the case of a circuit according to the invention, more specifically compliant with the circuit of FIG. 3, with N=3.

On the curve A, the signal INN has the shape of a potential square wave: INN passes directly from GND to VDD very swiftly, with a very short-duration transient phase (the time during which INN varies). Then INN is constant at VDD between t=0 and t=$\Delta N$.

On the curve B, the corresponding signal OUT follows the variations of the signal INN from the curve A; OUT is at VPP up to t=0, and then OUT decreases linearly from VPP to 0 between t=0 and t=$\Delta N$, with a constant slope proportional to INN and therefore proportional to VDD.

On the curve C, the signal INN has a staircase shape: it increases gradually and slowly from 0 to VDD in going through intermediate plateaus having increasing values VDD1, VDD2, VDD3.

On the curve D, the signal OUT follows the variations of the signal INN of the curve C: the signal OUT decreases, in the form of four straight-line portions having slopes respectively proportional to VDD1, VDD2, VDD3 and VDD, i.e. slopes that increase. It can be seen that this curve has changes in slope at the instants t=0, $\Delta_1$, $\Delta_2$, $\Delta_3$: in this example, these changes have a smaller amplitude than the amplitude of the change in slope of the curve B at the instant t=0.

A circuit according to an embodiment of the invention thus enables the slope of the output signal OUT to be modified slowly, in several steps corresponding to the plateaus through which the signal INN passes.

Such limited changes in amplitude of the slope of the signal OUT may limit the electromagnetic radiation that appears at the instants of the changes in slope.

In the example of FIG. 4, N has been chosen to be equal to 4. Experience shows that the theoretically ideal curve for the potential OUT, i.e. the curve theoretically entailing the smallest degree of electromagnetic radiation, is a sinusoid which can be approached by using a high value of N. In practice, the choice of N will be a compromise between low electromagnetic radiation (hence with N as a high value) and the total size of the control circuit, for which the number of arms increases naturally as a function of N.

Equally, in the example of FIG. 4, plateaus of potentials VDD1, VDD2, VDD3 have been chosen, evenly distributed between GND and VDD, and time intervals $\Delta_1$, $\Delta_2$, $\Delta_3$ evenly distributed between t=0 et T=$\Delta_4$. Naturally, all intervals of potential plateaus and time intervals can be envisaged, and it is not necessary that they should be regular. The choice may be made to minimize the electromagnetic radiation and may take account especially of the value of VDD, the value of $\Delta_4$ and the electronic components available to make the potential drop circuits and the delay circuits. One or both of the circuits of FIGS. 2 and 3 may be part of a system that includes a plasma display screen, which is driven by one or both of the circuits of FIGS. 2 and 3. Furthermore, one or both of the circuits of FIGS. 2 and 3 may have some or all of their components integrated on one or more integrated circuits which may be coupled to another integrated current such as a controller. Or, the controller and circuits of FIG. 2 and/or the circuit of FIG. 3 may be disposed on a single integrated circuit.

From the foregoing it will be appreciated that, although specific embodiments of the invention have been described herein for purposes of illustration, various modifications may be made without deviating from the spirit and scope of the invention.

What is claimed:

1. A circuit, comprising:
an output node;
an output stage operable, in response to a control signal, to generate at the output node an output signal having an edge with a duration and a slope; and
a control stage coupled to the output stage and operable to generate the control signal having,
a first magnitude during a first portion of the duration, and
a second magnitude during a second portion of the duration.

2. The circuit of claim 1 wherein the output signal comprises a voltage signal.

3. The circuit of claim 1 wherein the slope has a negative value throughout the duration.

4. The circuit of claim 1, further comprising:
an input node operable to receive an input signal; and
wherein the control stage is operable to cause the output stage to generate the output signal in response to the input signal.

5. The circuit of claim 1, further comprising a capacitive load coupled to the output node.

6. The circuit of claim 1 wherein the slope of the output signal takes on a value corresponding to the first magnitude during the first portion of the duration.

7. The circuit of claim 1 wherein the slope of the output signal takes on a value corresponding to the second magnitude during the second portion of the duration.

8. A circuit, comprising:
an output node;
an output stage operable, in response to a control signal, to generate at the output node an output signal having an edge with a duration and a slope; and
a control stage coupled to the output stage and operable to generate the control signal having,
a first magnitude during a first portion of the duration,
a second magnitude during a second portion of the duration; and
a reference node; and
wherein the output stage includes a transistor having a control node coupled to the control stage, a first drive node coupled to the output node, and a second drive node coupled to the reference node.

9. A circuit, comprising:
an output node;
an output stage operable to generate at the output node an output signal having an edge with a duration and a slope; and
a control stage coupled to the output stage and operable to cause the slope to have,
a first magnitude during a first portion of the duration, and
a second magnitude during a second portion of the duration;
wherein the control stage is further operable to generate a control signal and to couple the control signal to the output stage, the control signal having a first amplitude during the first portion of the duration and having a second amplitude during a second portion of the duration.

10. A circuit, comprising:
an output node;
an output stage operable to generate at the output node an output signal having an edge with a duration and a slope; and
a control stage coupled to the output stage and operable to cause the slope to have,
a first magnitude during a first portion of the duration, and
a second magnitude during a second portion of the duration;
wherein the control stage comprises:
a first generator operable to generate a control signal having a first amplitude and to couple the control signal to the output stage during the first portion of the duration, and
a second generator coupled to the first generator and operable to cause the control signal to have a second amplitude during the second portion of the duration.

11. A system, comprising:
a display screen having a cell; and
a driver coupled to screen, the driver comprising,
an output stage operable, in response to a control signal, to generate a cell driving signal having an edge with a duration and a slope, and
a control stage coupled to the output stage and operable to generate the control signal having,
a first magnitude during a first portion of the duration, and
a second magnitude during a second portion of the duration.

12. The system of claim 11 wherein the display screen comprises a plasma display screen.

13. The system of claim 11, further comprising:
wherein the driver is disposed on a first integrated circuit; and
a controller coupled to the driver and disposed on a second integrated circuit.

14. The system of claim 11, further comprising:
wherein the driver is disposed on an integrated circuit; and
a controller coupled to the driver and disposed on the integrated circuit.

15. The circuit of claim 11 wherein the slope of the output signal takes on a value corresponding to the first magnitude during the first portion of the duration.

16. The circuit of claim 11 wherein the slope of the output signal takes on a value corresponding to the second magnitude during the second portion of the duration.

17. The circuit of claim 11 wherein the first magnitude is substantially constant during the first portion of the duration, and the second magnitude is substantially constant during the second portion of the duration.

18. A circuit, comprising:

an output node;

an output stage operable, in response to a control signal, to generate at the output node an output signal having an edge with a duration and a slope; and a control stage coupled to the output stage and operable to generate the control signal having, a first magnitude during a first portion of the duration, and a second magnitude during a second portion of the duration;

wherein the first magnitude is substantially constant during the first portion of the duration, and the second magnitude is substantially constant during the second portion of the duration.

19. A system, comprising:

a display screen having a cell; and a driver coupled to screen, the driver comprising, an output node;

an output stage operable to generate at the output node an output signal having an edge with a duration and a slope; and a control stage coupled to the output stage and operable to generate a control signal, the control signal having a first amplitude during the first portion of the duration and having a second amplitude during a second portion of the duration, couple the control signal to the output stage, and cause the slope to have a first magnitude during a first portion of the duration, and a second magnitude during a second portion of the duration.

20. A system, comprising:

a display screen having a cell; and a driver coupled to screen, the driver comprising, an output node;

an output stage operable to generate at the output node an output signal having an edge with a duration and a slope; and a control stage coupled to the output stage and operable to cause the slope to have a first magnitude during a first portion of the duration, and a second magnitude during a second portion of the duration, the control stage comprising a first generator operable to generate a control signal having a first amplitude and to couple the control signal to the output stage during the first portion of the duration, and a second generator coupled to the first generator and operable to cause the control signal to have a second amplitude during the second portion of the duration.

\* \* \* \* \*